(12) United States Patent
Craig et al.

(10) Patent No.: US 6,397,160 B1
(45) Date of Patent: May 28, 2002

(54) POWER SENSOR MODULE FOR MICROWAVE TEST SYSTEMS

(75) Inventors: Thomas Michael Craig, Westford; Matthew Thomas Begg, Waltham, both of MA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 09/325,834

(22) Filed: Jun. 4, 1999

(51) Int. Cl.[7] ............................................... G01R 31/00
(52) U.S. Cl. ..................... 702/120; 324/142; 324/158.1; 324/601; 324/614
(58) Field of Search .................. 702/120, FOR 106, 702/FOR 107, FOR 110, FOR 155; 324/158.1, 637, 601, 613, 614

(56) References Cited

U.S. PATENT DOCUMENTS

| | | | |
|---|---|---|---|
| 4,733,170 A | 3/1988 | McAllister et al. | 324/95 |
| 4,789,823 A | 12/1988 | Delfs et al. | 324/95 |
| 4,958,294 A | 9/1990 | Herscher et al. | 364/483 |
| 5,175,492 A * | 12/1992 | Wong et al. | 324/158 R |
| 5,204,613 A | 4/1993 | Cripps et al. | 324/95 |
| 5,204,614 A | 4/1993 | Szente et al. | 324/95 |
| 5,214,372 A | 5/1993 | Vaisanen et al. | 324/95 |
| 5,370,458 A | 12/1994 | Goff | 374/122 |
| 5,416,422 A * | 5/1995 | Dildine | 324/614 |
| 5,929,628 A * | 7/1999 | Becker et al. | 324/158.1 |
| 6,049,212 A * | 4/2000 | Oldfield | 324/648 |
| 6,066,953 A * | 5/2000 | Wadell | 324/601 |

OTHER PUBLICATIONS

Giga-tronics, *Series 8540B Universal Power Meters*, pp. 4–1 through 4–13.

* cited by examiner

*Primary Examiner*—Arthur T. Grimley
*Assistant Examiner*—John Le
(74) *Attorney, Agent, or Firm*—Teradyne Legal Dept.

(57) ABSTRACT

A module for use in automatic test equipment is disclosed. The module is especially useful for performing power measurements on high frequency devices. The module includes a power sensor and a plurality of EEPROM's that store reflection coefficient data for the power sensor. Computerized control circuitry in the automatic test equipment uses the stored data to reduce impedance mismatch uncertainties in the power measurements.

5 Claims, 5 Drawing Sheets

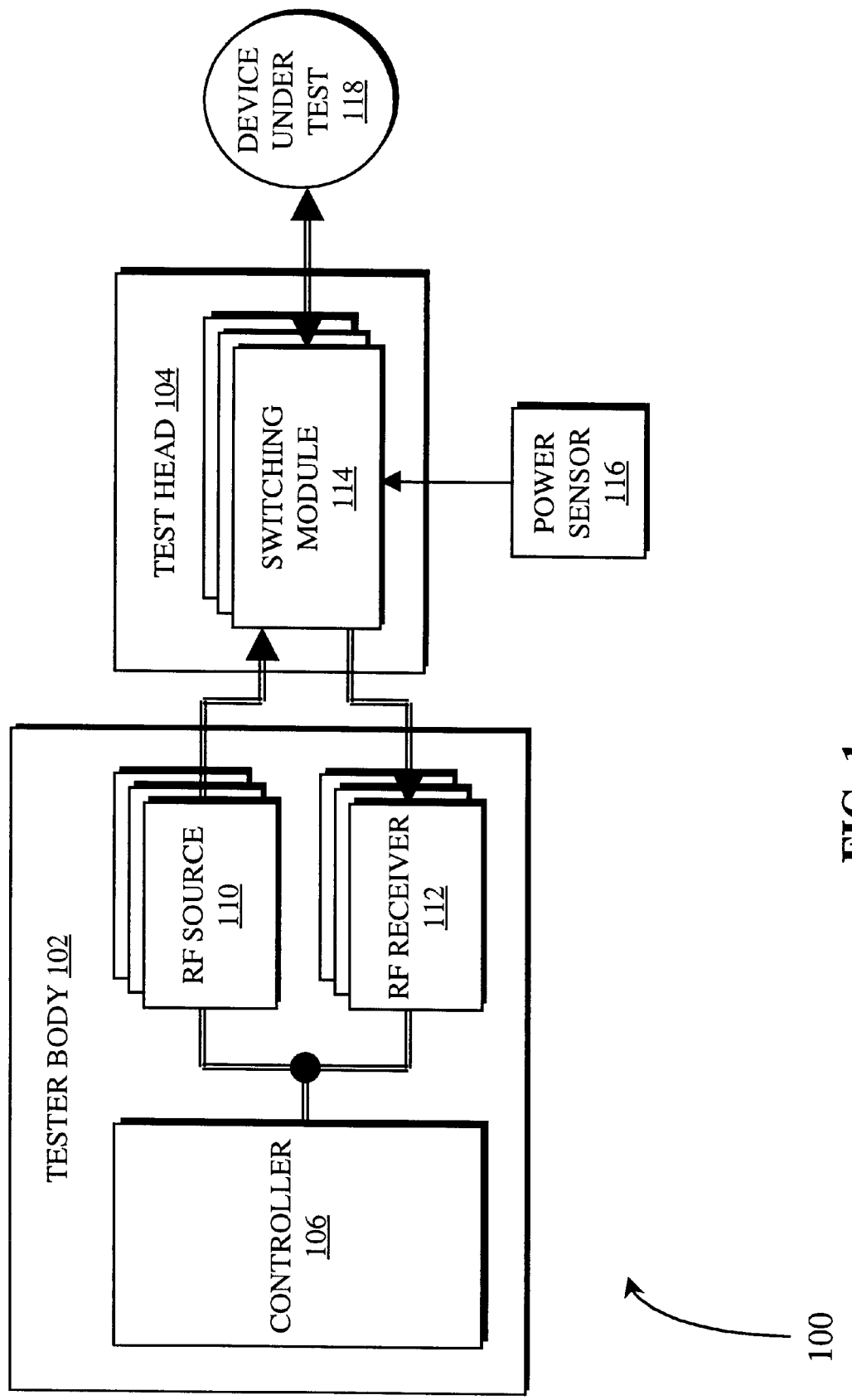
FIG. 1 - PRIOR ART the tester 100 has a tester body 102, which includes a computerized controller 106 that can be programmed by a tester operator to perform various test and analysis operations. For example, the controller 106 may be programmed to control RF signal sources (e.g., an RF source 110) and receivers (e.g., an RF receiver 112). The RF source 110 and the RF receiver 112 generate and detect, respectively, test signals for the DUT 118.

The tester 100 also includes a test head 104, which generally routes the test signals between the tester body 102 and the DUT 118. Accordingly, the test head 104 includes switching modules (e.g., a switching module 114) for directing the test signals between the RF source 110, the RF receiver 112, and the DUT 118.

In a typical test configuration, an external power sensor 116, such as the model HP ECP-E18A power sensor sold by Hewlett-Packard Company, Palo Alto, Calif., USA, is coupled to the switching module 114 and used for measuring power generated by the DUT 118. Thus, the switching module 114 also routes signals between the power sensor 116 and the DUT 118. The power sensor 116 is also typically coupled to a power meter (not shown), such as the model HP EPM-441A power meter sold by Hewlett-Packard Company.

We have recognized that performing power measurements using the test configuration described above may result in measurement uncertainties, which can adversely affect the accuracy of the power measurements.

For example, a major cause of measurement uncertainty is impedance mismatch between the power sensor and the device under test. This impedance mismatch can cause signal reflections that affect the amount of power provided to the power sensor, thereby resulting in inaccurate power measurements. Further, impedance mismatches tend to be more prevalent in test systems operating in high frequency ranges.

In addition, different test systems can yield different levels of impedance mismatch. This means that power measurements made on the same device might vary from tester-to-tester. Further, testers such as the tester 100 are meant to test and characterize devices in volume quantities. However, different levels of impedance mismatch might result with each device tested. This means that power measurements made by the same tester might vary from device-to-device. These tester-to-tester and device-to-device variations can lead to inconsistent power measurements, which are undesirable in mass production environments.

We have also recognized that it can be both cumbersome and costly to incorporate an external power sensor into a test system.

It would therefore be desirable to have a tester that can perform power measurements with less measurement uncertainty. Such a tester would therefore be able to measure power with greater accuracy and give a clearer indication of the performance of RF/microwave devices. It would also be desirable to have a tester for RF/microwave devices that is easier and less costly to manufacture.

SUMMARY OF THE INVENTION

With the foregoing background in mind, it is an object of the invention to provide a tester for testing and characterizing RF/microwave devices.

Another object of the invention is to provide a tester that performs power measurements with increased accuracy.

Still another object of the invention is to provide an easy way to account for tester-to-tester and device-to-device variations while performing power measurements.

Yet another object of the invention is to provide a tester for testing and characterizing RF/microwave devices that is easier and less costly to manufacture.

The foregoing and other objects are achieved in a tester having an integrated power sensor module including a power sensor and a plurality of programmable storage devices. The storage devices are programmed with mismatch data relating to the power sensor.

In a preferred embodiment, the power sensor module is plugged into a tester, thereby switchably connecting the module to one of a plurality of measurement channels.

According to one feature, the storage devices are programmed with reflection coefficients for the power sensor.

According to another feature, the plurality of programmable storage devices is implemented using a plurality of EEPROM's.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a partial block diagram of a conventional tester;

DESCRIPTION OF THE PREFERRED EMBODIMENT

Figure 2A:
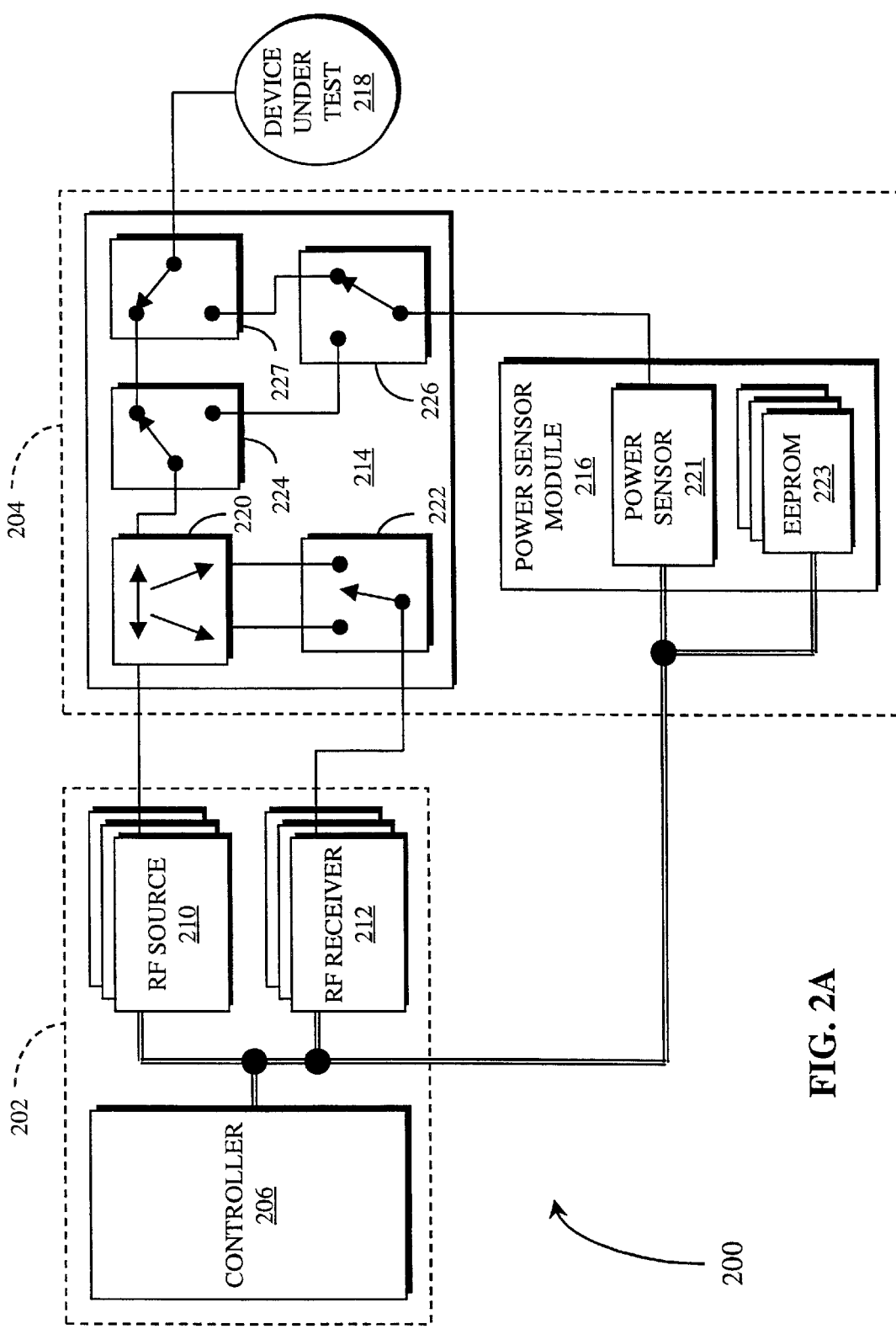
FIG. 2A is a block diagram of a tester incorporating a power sensor module in accordance with the present invention.

FIG. 2A shows a partial block diagram of a tester 200 in accordance with the present invention. The tester 200 includes a tester body 202, which incorporates programmable controller circuitry 206. Further, the tester 200 is primarily meant to be used for testing and characterizing high frequency semiconductor devices, such as those used in cellular telephone equipment. These devices are typically designed to operate in the frequency range of about 10 MHz to 6 GHz. For this reason, the tester body 202 also includes a plurality of RF/microwave signal sources (e.g., an RF source 210) and a plurality of RF/microwave signal receivers (e.g., an RF signal receiver 212).

A tester operator can program the controller 206 to perform various operations for testing, analyzing, and characterizing high frequency devices. For example, the tester operator may program the controller 206 for directing the RF source 210 to provide RF test signals for a device under test, and for directing the RF receiver 212 to detect RF signals produced by the device under test in response to the test signals.

Because high frequency devices under test often include lower frequency analog circuitry and digital circuitry, the tester body 202 also includes circuitry (not shown) for generating and detecting low frequency AC signals, and digital signals. Further, the tester body 202 also includes circuitry for generating DC levels (not shown).

It should be understood that the tester body 202 is meant to incorporate elements that are well known in the art and may be found in conventional testers. The exact implementation of these elements and their configuration in the tester body 202 is therefore not critical to the invention.

The tester 200 also includes a test head 204 incorporating at least one switching module 214. Additional details about the general structure and operation of the switching module 214 can be obtained by referring to U.S. Pat. No. 5,572,160, assigned to TERADYNE®, Inc., Boston, Mass., USA, which is incorporated herein by reference. For example, the switching module 214 includes a plurality of directional elements, such as a directional coupler 220, and a plurality of switches, such as switches 222, 224, 226, and 227. The switching module 214 also includes circuitry (not shown) for controlling the operation of the directional elements and the switches. The programmable controller 206 generally directs the operation of this circuitry.

In particular, the directional coupler 220 is a four-port device. As shown in FIG. 2A, one port of the directional coupler 220 is connected to the RF source 210 and another port is connected to the pole of the switch 224, which may be actuated in conjunction with the switch 227 to connect the directional coupler 220 to a device under test (DUT) 218. Accordingly, one port may be regarded as being on the "source-side" of the directional coupler 220, while another port may be regarded as being on the "DUT-side" of the directional coupler 220. The RF source 210 can therefore produce an RF/microwave test signal that passes from the source-side to the DUT-side of the directional coupler 220, through the switches 224 and 227, to an electrical node of the DUT 218.

The directional coupler 220 also has two ports that are coupled to the throws of the switch 222. These ports are commonly referred to as the "forward" and "reverse" ports of the directional coupler 220. In particular, the forward port can be viewed as being coupled to a signal provided to the port on the source side of the coupler 220. Similarly, the reverse port can be viewed as being coupled to a signal provided to the port on the DUT side of the coupler 220. The switch 222 can therefore be actuated to connect the RF receiver 212 to either the forward or the reverse port of the directional coupler 220.

The switching module 214 shown in FIG. 2A is a simplified version of a switching module used in the tester 200. Practical switching modules generally include a plurality of paths or channels to a device under test. For example, FIG. 2C shows a more detailed block diagram of the switching module 214, which now includes two channels 238 and 239 to the DUT 218. The channels 238 and 239 may be used for applying and measuring respective signals at leads of the DUT 218. Alternatively, signals on the channels 238 and 239 may be combined using the intermodulation (IM) path interconnecting directional elements 245 and 259 and switches 246 and 260.

As mentioned above, the tester 200 is primarily meant to be used for testing and characterizing RF/microwave devices. It is generally difficult to measure voltage and current levels of signals produced by such devices. For this reason, the tester 200 is frequently used for performing power measurements, which can be used to characterize device performance. It is therefore important to be able to perform power measurements on these devices as accurately as possible.

For this reason, the test head 204 also incorporates a power sensor module 216, which includes a power sensor 221 and a plurality of programmable memory devices (e.g., a device 223). In the preferred embodiment, the memory device 223 is implemented using an EEPROM, such as the X24645 EEPROM sold by XICOR®, Inc., Milpitas, Calif., USA.

Figure 2B:
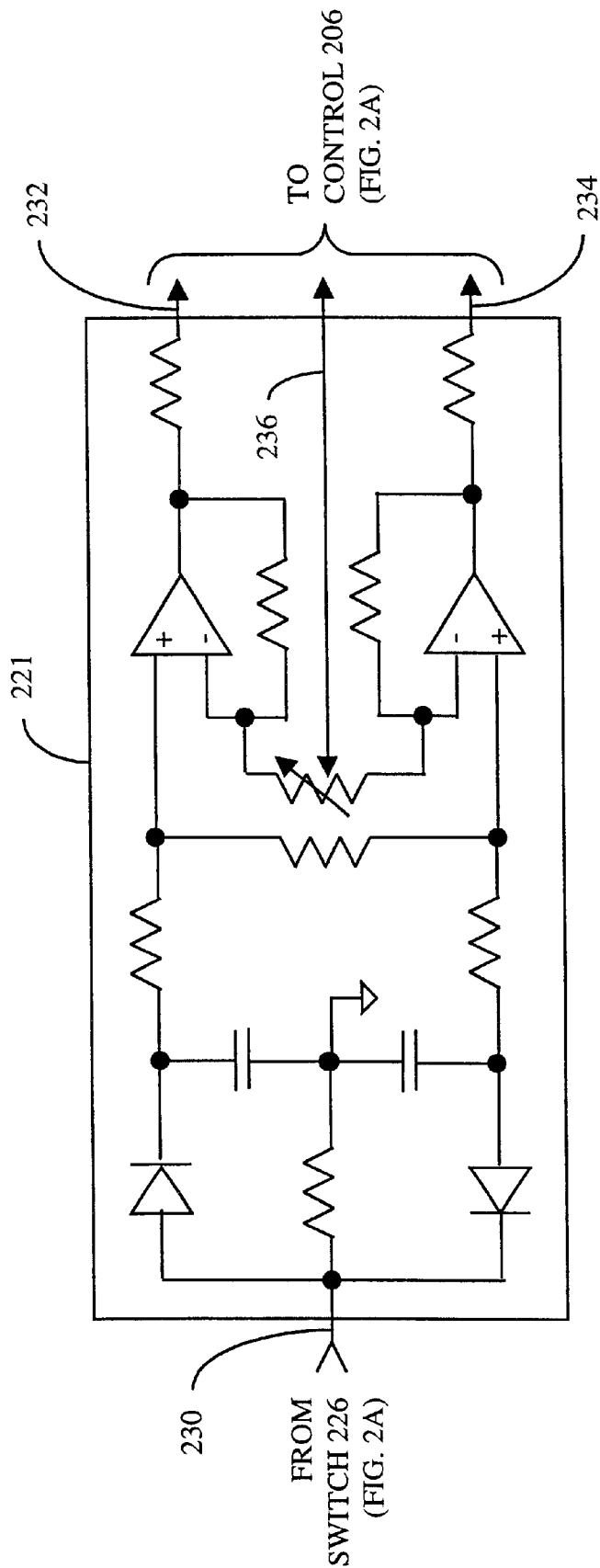
FIG. 2B is a schematic diagram of a power sensor included in the power sensor module shown in FIG. 2A.
Figure 2C:
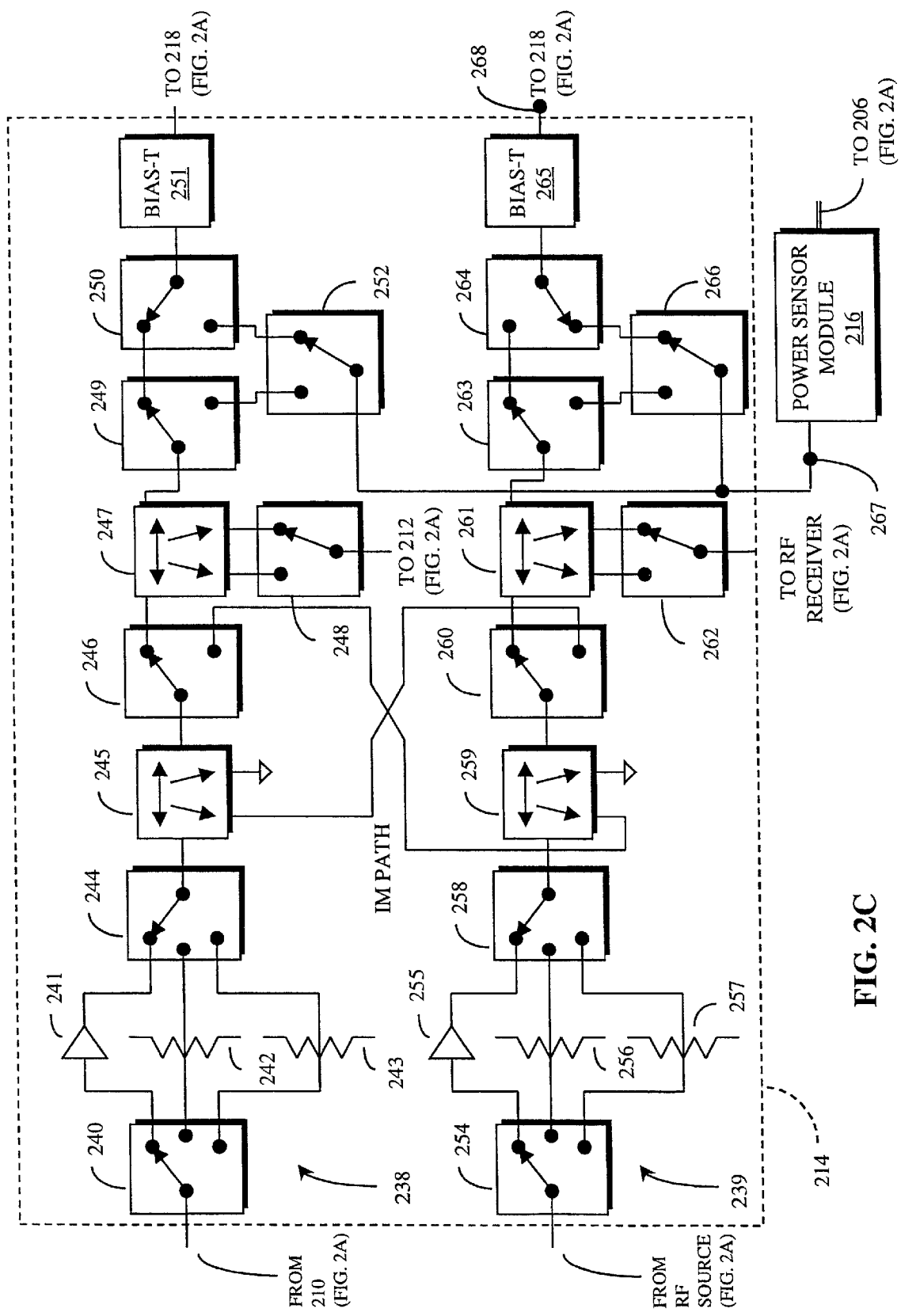
FIG. 2C is a schematic diagram of a switching module coupled to the power sensor module of the FIG. 2A apparatus.

Further, the power sensor 221 is preferably implemented as shown in the schematic diagram of FIG. 2B. For example, switches 226 and 227 may be actuated to connect the DUT 218 to the power sensor 221. Accordingly, an RF/microwave signal produced by the DUT 218 may be applied to the power sensor 221 on line 230.

The power sensor 221 shown in FIG. 2B is a preferably a precision power device that converts RF inputs into DC voltage levels that are proportional to the power levels of the RF inputs. Accordingly, an RF input is applied to the line 230, and positive and negative DC output levels are provided on lines 232 and 234, respectively. The DC outputs on lines 232 and 234 may be applied to a precision A-to-D converter (not shown) before being provided to the controller 206 for analysis. Further, a control line 236 is preferably provided for range selection.

The switch 226 may alternatively be actuated in conjunction with the switch 224 and the directional coupler 220 to connect the power sensor 221 to the RF source 210. Consequently, the power sensor 221 may be used for measuring power provided by the RF source 210.

In the preferred embodiment, the power sensor 221 and the EEPROM's (e.g., EEPROM 223) are situated on the same assembly and collectively constitute the power sensor module 216. Further, suitable connectors are used to facilitate the transmission of data from the power sensor 221 and the EEPROM's to the controller 206, and the transmission of signals between the power sensor 221 and the switching module 214. Accordingly, the power sensor module 216 is preferably plugged into the tester 200, thereby making the power sensor module 216 easily connectable and interchangeable.

As mentioned above, power measurements are frequently used to characterize the performance of RF/microwave devices. A simplified process for making power measurements on a device under test includes applying test signals to the device under test and then measuring the power produced by the device in response to the test signals.

Accordingly, the RF source 210, the directional coupler 220, and the switches 224 and 227 can be controlled for applying test signals to the DUT 218. Further, the power sensor 221 and the switches 226 and 227 can be similarly controlled for making power measurements on the DUT 218 outputs.

However, in a practical measurement configuration, the input and output impedances of various elements of the test system are not perfectly matched. Consequently, signal reflections can occur along the transmission paths between the system elements. This means that signals applied to the power sensor 221 may be partially reflected, thereby affecting the amount of power provided to the power sensor 221 and causing uncertainties in power measurements. These uncertainties are commonly called "mismatch" uncertainties.

Because there may also be impedance mismatch between the DUT 218 and the switching module 214, a portion of the signal produced by the DUT 218 is generally reflected from the switching module circuitry back toward the DUT 218. This phenomenon may be referred to as the first order effects of the reflected signal.

Further, because the switching module 214 is configured so that the signal passes from the DUT 218 to the power sensor 221, a remaining portion of the signal passes through the switching module 214 to the power sensor 221. The impedance mismatch at the power sensor 221 then generally causes another portion of the signal to be reflected back toward the DUT 218. This phenomenon may be referred to as the second order effects of the reflected signal.

A novel way of compensating for the effects of reflected signals in microwave test systems is described in U.S. patent application Ser. No. 08/955,782, assigned to TERADYNE®, Inc., which is incorporated herein by reference. That application describes a calibration procedure that includes the step of calculating the "s-parameters" (i.e., $S_{11}$, $S_{12}$, $S_{21}$, and $S_{22}$) of switching module circuitry. These s-parameters can be viewed as forming a mathematical model of the switching module circuitry. For example, a vector network analyzer (VNA) and known calibration techniques may be used to determine s-parameters for the switching module 214.

The VNA may also be used to measure the reflection coefficient, $\Gamma_{PS}$, of the power sensor module 216, and the reflection coefficient, $\Gamma_{DUT}$, of the DUT 218. Once the s-parameters of the switching module 214 and the reflection coefficients of the power sensor module 216 and the DUT 218 are known, the first and second order effects of the reflected noise signal can be calculated and used to make appropriate corrections when performing power measurements.

An important advantage of the present invention is that the reflection coefficient, $\Gamma_{PS}$, for the power sensor module 216 is preferably measured and stored in the EEPROM's before the power sensor module 216 is plugged into the tester 200. This simplifies the calibration of the tester 200 for power measurements because the reflection coefficients, $\Gamma_{PS}$, stay with the power sensor module 216.

Accordingly, when a power sensor module is added to a tester, or when a power sensor module in a tester is interchanged with a different power sensor module, it is not necessary to measure the reflection coefficient $\Gamma_{PS}$ before using the tester to perform power measurements. This is because the reflection coefficient $\Gamma_{PS}$ is easily accessed from the EEPROM's included with the power sensor module.

Figure 3:
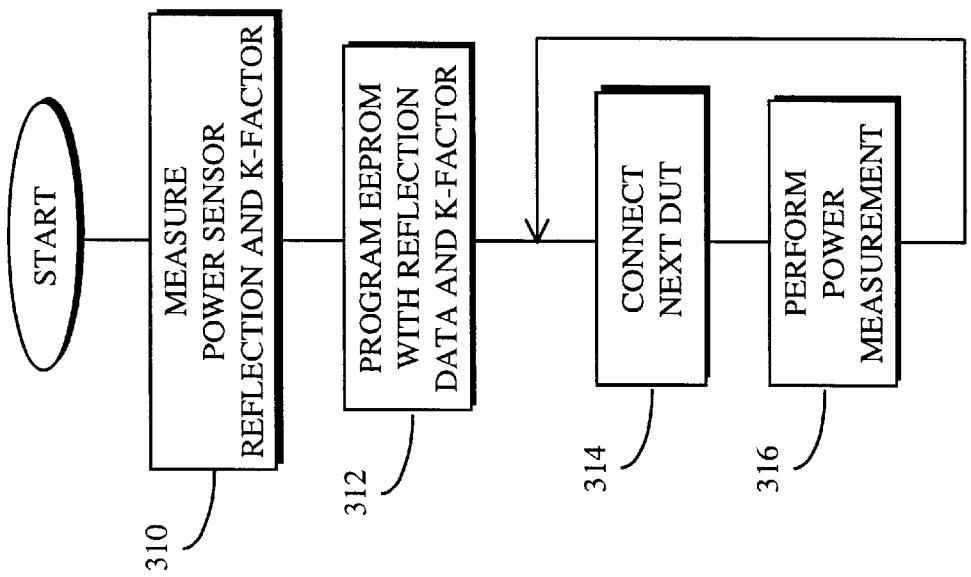
FIG. 3 is a flowchart diagram of a method for performing power measurements using the FIG. 2A apparatus.

A method of measuring power provided by signals produced by a device under test is preferably implemented in accordance with the procedure shown in FIG. 3. This procedure is performed under control of software that is programmed into the controller 206 included in the tester body 202.

First, mismatch data relating to reflections at the power sensor 221 is computed in block 310. This mismatch data includes the reflection coefficient $\Gamma_{PS}$. In the preferred embodiment, the reflection coefficient, $\Gamma_{PS}$, is measured using a VNA connected to the power sensor module 216, which is unplugged from the tester 200. Accordingly, the VNA measures the reflection coefficient, $\Gamma_{PS}$, looking into a port 267 (FIG. 2C) of the power sensor module 216. Further, because the DUT 218 is capable of producing signals across a bandwidth, $\Gamma_{PS}$ is preferably determined at various frequencies across the bandwidth.

After the desired number of reflection coefficients, $\Gamma_{PS}$, is determined in block 310, the reflection coefficients and their corresponding frequencies are programmed into EEPROM's in block 312. The manner in which the reflection coefficients and their corresponding frequencies are programmed into the EEPROM's is not critical to the invention.

A power sensor module in accordance with the present invention therefore includes a power sensor and EEPROM's programmed with reflection coefficient data directly relating to the power sensor. The power sensor module may then be plugged into a tester, which uses the data stored in the EEPROM's to reduce mismatch uncertainty and therefore increase power measurement accuracy.

Blocks 310 and 312 of the procedure shown in FIG. 3 are primarily meant to be performed during an initial calibration of the power sensor module 216 and the tester 200. Blocks 310 and 312 are therefore performed relatively infrequently. However, blocks 314 and 316 are meant to be performed repeatedly in a manufacturing process for quickly performing power measurements on volume quantities of RF/microwave devices.

In particular, an RF/microwave device under test, such as the DUT 218, is connected to the tester 200 in block 314. A device under test is generally connected to a tester through a device interface board. Further, connections between the device under test and the tester may be made in an automatic fashion using an automated chip handling apparatus. Alternatively, these connections might be made manually.

Next, power provided by the DUT 218 is measured by the power sensor 221 in block 316. Accordingly, switches 264 and 266 (FIG. 2C) in the switching module 214 may be actuated to pass an RF input from a bias-T network 265 (FIG. 2C) to the power sensor module 216. The power sensor 221 then converts the RF input into a DC voltage level that is proportional to the power level of the RF input.

Further, the mismatch data stored in the EEPROM's is used to compute the reflection coefficient, $\Gamma_{PS,\ CORRECTED}$, looking into a port, such as a port 268 (FIG. 2C), of the switching module 214. The corrected mismatch data for the port 268 may be computed using the formula $$\Gamma_{PS,\ CORRECTED} = S_{22} + (S_{21}S_{12}\Gamma_{PS})/(1-\Gamma_{PS}S_{11}) \qquad \text{(eq. 1)}.$$

Accordingly, the s-parameters $S_{11}$, $S_{12}$, $S_{21}$, and $S_{22}$ of the switching module 214 looking into the port 268 are also measured. The s-parameters are preferably measured using a VNA connected externally to the tester 200. For example, the VNA may be connected to a tester pin on a device interface board (not shown), which serves as an interface between the test head 204 and the DUT 218. This tester pin may in turn be connected to the port 268 (FIG. 2C) of the switching module 214. Further, the s-parameters are preferably measured at the same frequency points as the reflection coefficients determined in block 310.

The corrected mismatch data may be stored in a memory (not shown) included in the controller 206. Both the manner and means of storing the corrected mismatch data are not critical to the invention.

The corrected mismatch data is then used to make corrections to the power measured in block 316. These corrections are preferably made computationally using techniques that are known to those skilled in this art. Further, the power measurement corrections may be made by the controller 206 when analyzing the power measured by the power sensor module 216.

Having described one embodiment, numerous alternative embodiments or variations might be made. For example, it was described that the power sensor module of the present invention is preferably incorporated into highly automated test equipment. However, this was merely an illustration. The power sensor module might alternatively be used with less automated test systems.

Further, particular tester architecture was described including a tester body and a test head. However, this was also merely an illustration. The power sensor module may be used with a tester of any architecture. The power sensor module may also be used with measurement instruments that are designed for bench-top use.

In addition, it was described that EEPROM's are used for storing mismatch data in the power sensor module. However, this was also merely an illustration. Any programmable non-volatile storage devices might alternatively be used.

Also, the EEPROM's can be used to store other data besides mismatch data. For example, it may be useful to store K-Factor data particular to a power sensor. As is known, K-Factor is related to the efficiency of a power sensor, and is a function of $(1-|\Gamma_{PS}|^2)$.

In addition, FIG. 2B shows a schematic diagram of a particular implementation of the power sensor included with the power sensor module. However, FIG. 2B is only meant to be illustrative. Any useful power sensor circuit might alternatively be used.

In addition, FIG. 3 shows a particular sequence of steps for performing power measurements using the power sensor module. However, this was also merely an illustration. The steps shown in FIG. 3 may be performed in any useful and convenient order so long as the power sensor module is fully programmed before any power measurements are made.

Therefore, the invention should be limited only by the spirit and scope of the appended claims.

What is claimed is:

1. A method of constructing an automatic test system for compensating for errors in the testing of microwave components, comprising:

(A) measuring a reflection coefficient $\Gamma_{PS}$ of a modular microwave power sensor;

(B) storing the reflection coefficient $\Gamma_{PS}$ in a non-volatile memory provided with the modular microwave power sensor;

(C) installing the modular microwave power sensor into the automatic test system;

(D) measuring a plurality of S-parameters of the automatic test system; and (E) storing the plurality of S-parameters in the automatic test system so that they can be accessed in connection with the reflection coefficient $\Gamma_{PS}$ from the modular microwave power sensor to correct power measurements of devices under test, wherein the modular microwave power sensor is interchangeable with other substantially identical power sensors having different reflection coefficients $\Gamma_{PS}$, for providing substantially the same accuracy as the modular microwave power sensor initially installed, without requiring re-calibration of the automatic test system.

2. A method as recited in claim 1, further comprising:

correcting power measurements made by the modular microwave power sensor by applying a correction factor, $\Gamma_{PS,\ CORRECTED}$, which substantially equals $S_{22}+(S_{21}S_{12}\Gamma_{PS})/(1-\Gamma_{PS}S_{11})$, wherein $S_{11}$, $S_{12}$, $S_{21}$, and $S_{22}$ are at least some of the plurality of S-parameters of the automatic test system.

3. A method as recited in claim 1, further comprising:

applying a test signal to a device under test;

detecting a signal from the device under test, the detected signal being produced by the device under test in response to the applied test signal; and measuring a characteristic of the detected signal, comprising the substeps of
(1) accessing data from the non-volatile memory, and
(2) using the data accessed for reducing uncertainties in the characteristic measured.

4. A method of constructing an automatic test system for compensating for errors in the testing of microwave components, comprising:

(A) measuring a reflection coefficient $\Gamma_{PS}$ of a modular microwave power sensor;

(B) storing the reflection coefficient $\Gamma_{PS}$ in a non-volatile memory provided with the modular microwave power sensor;

(C) installing the modular microwave power sensor into the automatic test system;

(D) measuring a plurality of S-parameters of the automatic test system;

(E) storing the plurality of S-parameters in the automatic test system so that they can be accessed in connection with the reflection coefficient $\Gamma_{PS}$ from the modular microwave power sensor to correct power measurements of devices under test; and (F) correcting power measurements made by the modular microwave power sensor by applying a correction factor, $\Gamma_{PS,\ CORRECTED}$, which substantially equals $S_{22}+(S_{21}S_{12}\Gamma_{PS})/(1-\Gamma_{PS}S_{11})$, wherein $S_{11}$, $S_{12}$, $S_{21}$, and $S_{22}$ are at least some of the plurality of S-parameters of the automatic test system.

5. A method of constructing an automatic test system for compensating for errors in the testing of microwave components, comprising:

(A) measuring a reflection coefficient $\Gamma_{PS}$ of a modular microwave power sensor;

(B) storing the reflection coefficient $\Gamma_{PS}$ in a non-volatile memory provided with the modular microwave power sensor; and (C) installing the modular microwave power sensor into the automatic test system, wherein the modular microwave power sensor is interchangeable with other substantially identical power sensors having different reflection coefficients $\Gamma_{PS}$, for providing substantially the same accuracy as the power sensor initially installed, without requiring re-calibration of the automatic test system.

* * * * *